(12) United States Patent
Shimazu

(10) Patent No.: US 8,558,191 B2
(45) Date of Patent: Oct. 15, 2013

(54) CHARGED PARTICLE BEAM LENS AND CHARGED PARTICLE BEAM EXPOSURE APPARATUS

(71) Applicant: Canon Kabushiki Kaisha, Tokyo (JP)

(72) Inventor: Akira Shimazu, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/744,536

(22) Filed: Jan. 18, 2013

(65) Prior Publication Data

US 2013/0206999 A1    Aug. 15, 2013

(30) Foreign Application Priority Data

Feb. 14, 2012   (JP) ................. 2012-029107

(51) Int. Cl.
*G21K 1/08*     (2006.01)
(52) U.S. Cl.
USPC ............. 250/396 R; 250/396 ML; 250/492.1; 250/492.3
(58) Field of Classification Search
None
See application file for complete search history.

(56) References Cited

U.S. PATENT DOCUMENTS

| 4,209,698 | A  * | 6/1980 | Hoppe ....................... 250/311 |
| 5,006,795 | A  * | 4/1991 | Yoshizawa et al. ....... 324/754.22 |
| 6,703,624 | B2 * | 3/2004 | Hamaguchi et al. ....... 250/492.2 |
| 6,787,780 | B2 * | 9/2004 | Hamaguchi et al. .......... 250/398 |
| 6,872,950 | B2 * | 3/2005 | Shimada et al. .......... 250/396 R |
| 8,148,702 | B2 * | 4/2012 | Doering et al. .......... 250/492.22 |
| 8,198,602 | B2 * | 6/2012 | Steenbrink et al. ....... 250/396 R |
| 8,362,441 | B2 * | 1/2013 | Koning et al. ............ 250/396 R |
| 2001/0028038 | A1 * | 10/2001 | Hamaguchi et al. ... 250/396 ML |
| 2001/0028043 | A1 * | 10/2001 | Hamaguchi et al. ....... 250/492.3 |
| 2001/0028044 | A1 * | 10/2001 | Hamaguchi et al. ....... 250/492.3 |
| 2003/0189180 | A1 * | 10/2003 | Hamaguchi et al. ....... 250/492.3 |
| 2005/0263715 | A1 * | 12/2005 | Nakasuji et al. ....... 250/396 ML |
| 2007/0131646 | A1 * | 6/2007 | Donnelly et al. ................ 216/2 |
| 2008/0023643 | A1 * | 1/2008 | Kruit et al. ............... 250/396 R |
| 2008/0315090 | A1 * | 12/2008 | Nakasuji et al. .............. 250/306 |
| 2009/0256075 | A1 * | 10/2009 | Kemen et al. ................. 250/307 |
| 2011/0001421 | A1 * | 1/2011 | Yamamoto et al. ........... 313/483 |
| 2011/0084220 | A1 * | 4/2011 | Koning et al. ............. 250/492.3 |
| 2011/0163244 | A1 * | 7/2011 | Kruit et al. ............... 250/396 R |
| 2011/0168910 | A1 * | 7/2011 | Kruit et al. ............... 250/396 R |
| 2011/0216299 | A1 * | 9/2011 | Steenbrink et al. ............. 355/67 |

FOREIGN PATENT DOCUMENTS

| JP | 3166946 | B2 | 3/2001 |
| JP | 4401614 | B2 | 1/2010 |

* cited by examiner

*Primary Examiner* — Andrew Smyth
(74) *Attorney, Agent, or Firm* — Fitzpatrick, Cella, Harper & Scinto

(57) ABSTRACT

A charged particle beam lens includes a first electrode on a downstream side and a second electrode on an upstream side in a travelling direction of a charged particle beam. Each of the first electrode and the second electrode has a first through hole formed therein, through which the charged particle beam passes. The second electrode further has a second through hole formed therein, through which the charged particle beam does not pass. A distance defining member is provided between the first electrode and the second electrode such that the first electrode and the second electrode are spaced away from each other. A gap is surrounded the first electrode, the second electrode, and the distance defining member, wherein both the first through and the second through hole communicate to the gap. A third through hole passes through the first electrode and the second electrode in the travelling direction of the charged particle beam, and the third through hole is provided outside of the gap and does not communicate to the gap.

6 Claims, 5 Drawing Sheets

CHARGED PARTICLE BEAM LENS AND CHARGED PARTICLE BEAM EXPOSURE APPARATUS

CLAIM OF PRIORITY

This application claims the benefit of Japanese Patent Application No. 2012-029107, filed Feb. 14, 2012, which is hereby incorporated by reference heroin in its entirety.

BACKGROUND OF THE INVENTION

1. Field of the Invention

The present invention relates to an electrostatic charged particle beam lens and a charged particle beam exposure apparatus using the same.

2. Description of the Related Art

In the production of a semiconductor device, electron beam exposure technology is prospective for lithography which enables fine pattern exposure of 0.1 µm or less. In an electron beam exposure apparatus, an electron-optical element for controlling optical characteristics of an electron beam is used.

In the electron beam exposure technology, for the purpose of attaining finer exposure, both high voltage application to an electron lens and thinning of the lens are required, and a high withstand voltage structure is necessary.

Further, in the electron beam exposure technology, the limit of fine processing is determined mainly by the optical aberration of the electron-optical element rather than by the diffraction limit of the electron beam, and thus, it is important to realize an electron-optical element having small aberration.

In order to attain this, first of all, the accuracy of the shape of the processed lens is required to be at a high level. For example, in order to stabilize fine pattern exposure on the order of 0.1 µm or less, the accuracy of the shape is required to be on the order thereof or finer.

Further, optical aberration is caused also by charge of members of the lens.

Further, in the electron beam exposure technology, contamination to be generated through application of the electron beam to a resist, that is, contamination ascribable to the resist is inevitable.

Contamination adhesion to the electron-optical system, such as the electron lens, causes deterioration of the shape of an opening in the lens and causes a charged state, which degrades the aberration and the withstand voltage.

In order to stabilize stable fine processing, measures against contamination are important. Japanese Patent No. 3166946 discloses a structure of an electron beam exposure apparatus in which a conductive plate-shaped body is provided between a sample and an objective lens for condensing an electron beam for the purpose of reducing charge by means of preventing or reducing adhesion of contamination, including a substance evaporated from the surface of the sample to the objective lens, and an electron beam deflector.

On the other hand, in order to reduce adhesion of contamination ascribable to the resist, it is effective to improve the vacuum to reduce the density of the contamination.

Japanese Patent No. 4401614 discloses a structure in which dummy openings are provided.

This structure is thought to be effective in reducing contamination adhesion, but, in this literature, the object is to make uniform focal points of multiple electron beams with respect to an object of the application for the purpose of exposing a pattern on the object of the application with accuracy. If the structure is used as it is, the effect against contamination adhesion, especially, around the center of the lens is thought to be small.

On the other hand, with regard to a method of removing contamination that has once adhered, generally, contamination is removed by plasma treatment or heat treatment.

However, with regard to an array of electron lenses, in particular, objective lenses, or the like, which include complex members and require that high accuracy of the shape thereof, the latter method is hardly used from the viewpoint of deformation and damage.

Further, in the electron beam exposure technology, realization of higher throughput is one of large issues, and a multibeam system is nominated for one of the solutions for it.

In the multi-beam system, it has been proposed to use an electron lens array in which electron lenses are arranged in a one-dimensional or two-dimensional array.

When the multi-beam system is adopted, measures against charge are necessary from the viewpoint of reducing optical aberration. In particular, in an electron lens array, measures against charge of a distance defining member (insulator) between electrodes are necessary. General examples of such measures against charge include forming an antistatic film on an insulating member, and placing the insulator away from an opening in an electrode of a lens.

In order to accommodate the demand for finer exposure technology with higher throughput, in an electron beam exposure apparatus, reduction of the aberration and adoption of the multi-beam system are necessary.

Among electrostatic lenses, in particular, an objective lens is required to have a higher withstand voltage structure, and to improve the accuracy of the shape thereof, in order to reduce the distance between the lens and the work, to use a multi-beam system of electron beams, to reduce the diameter and the pitch of the openings, and to use a higher electric field.

On the other hand, when a sample is exposed using an electron beam, the energy of the beam causes the resist, or the like, on the sample to scatter or to evaporate.

The resist, or the like, which scatters or evaporates adheres more onto an objective lens that is the nearest to the sample.

As the exposure continues for a long time, the amount of the adhering substance becomes larger and the adhering substance accumulates. The optical aberration characteristics of the objective lens are very sensitive to the shape of the opening.

Therefore, as the adhering substance ascribable to the resist, such as the resist, or the like, which scatters or evaporates, or a substance produced therefrom, accumulates on the opening, the optical aberration characteristics of the objective lens degrade accordingly.

Degradation of the optical aberration characteristics of the objective lens due to accumulation of such an adhering substance is a problem, and thus, as a solution for it, cleaning treatment of the lens is necessary.

In particular, the optical aberration characteristics are most sensitive to an intermediate electrode sandwiched between an upper electrode and a lower electrode of an objective lens, and the effect of cleaning treatment with regard to the intermediate electrode against the adhering substance ascribable to the resist, which is accumulated, is the smallest from the viewpoint of the structure, which is a problem.

SUMMARY OF THE INVENTION

In view of the above-mentioned problem, it is an object of the present invention to provide an electrostatic charged particle beam lens and a charged particle beam exposure apparatus that can reduce an accumulation that is ascribable to a resist and that adheres to the inside of the lens, and that can improve the effect of cleaning treatment against the accumulation on an opening in an electrode to which the optical aberration characteristics of the lens is most sensitive.

According to the present invention, a charged particle beam lens includes a first electrode on a downstream side and a second electrode on an upstream side in a travelling direction of a charged particle beam, a distance defining member provided between the first electrode and the second electrode such that the first electrode and the second electrode are placed away from each other, and a gap surrounded by the first electrode, the second electrode, and the distance defining member, in which each of the first electrode and the second electrode has a first through hole formed therein, through which the charged particle beam passes, the second electrode further has a second through hole formed therein, through which the charged particle beam does not pass, and both the first through hole and the second through hole communicate to the gap.

According to the present invention, the electrostatic charged particle beam lens and the charged particle beam exposure apparatus that reduce the accumulation that is ascribable to the resist and that adheres to the inside of the lens can be stabilized.

Further, the charged particle beam lens and the charged particle beam exposure apparatus that can improve the effect of cleaning treatment against the accumulation on the opening in the electrode to which the optical aberration characteristics of the lens are most sensitive can be stabilized.

Further features of the present invention will become apparent from the following description of exemplary embodiments with reference to the attached drawings.

DESCRIPTION OF THE EMBODIMENTS

An exemplary structure of an electrostatic charged particle beam lens having multiple lens electrodes according to an embodiment of the present invention is described with reference to FIGS. 1A and 1B. In this embodiment, a description is made with regard to an electrostatic charged particle beam lens including two lens electrodes as an example, but this does not mean that the structure of the present invention is limited thereto.

Figure 1A:
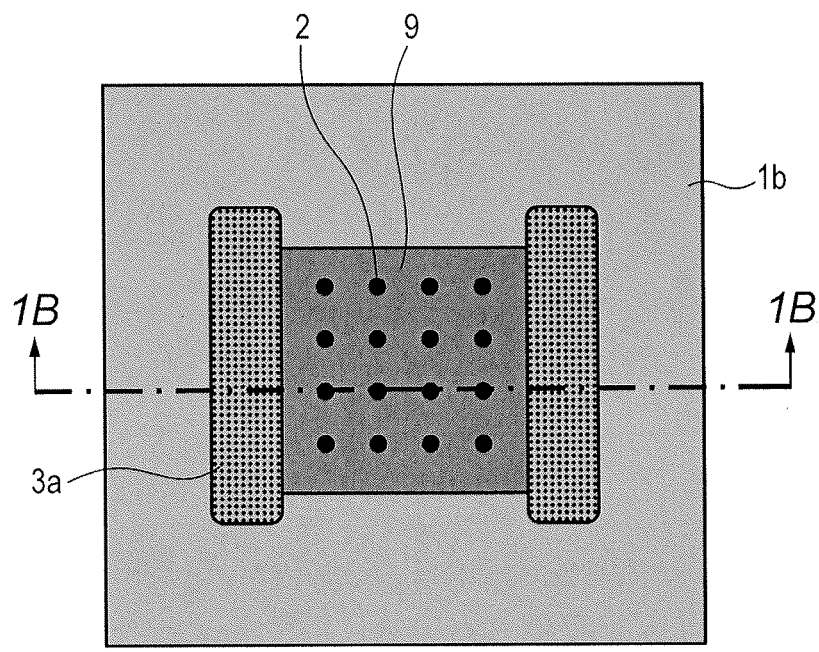
FIG. 1A is a schematic top view illustrating a structure of an electrostatic charged particle beam objective lens according to an embodiment of the present invention.

As illustrated in FIG. 1A, the electrostatic charged particle beam lens according to this embodiment is an electrostatic lens in which a pattern through which charged particle beams pass and other patterns are formed.

Figure 1B:
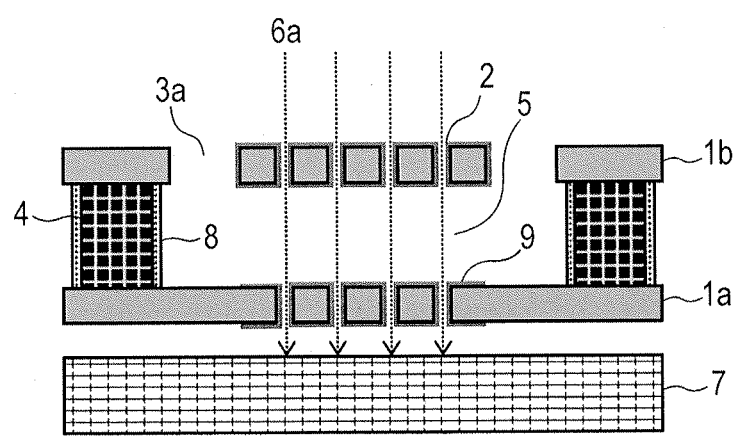
FIG. 1B is a schematic sectional view taken along the line 1B-1B of FIG. 1A.

Further, as illustrated in FIG. 1B, a first electrode 1a and a second electrode 1b are placed on a downstream side and on an upstream side, respectively, in the travelling direction of charged particle beams 6a. The first electrode 1a and the second electrode 1b are spaced away from each other by providing a distance defining member 4 therebetween. A gap 5 surrounded by the first electrode 1a, the second electrode 1b, and the distance defining member 4 is formed.

The electrodes 1a and 1b have first through holes 2 formed therein, and the electrode 1b further has second through holes 3a formed therein.

Note that, the first through holes 2 are through holes through which the charged particle beams 6a pass, and which communicate with the gap 5.

Further, the second through holes 3a are through holes which are formed in the second electrode 1b and that communicate with the gap 5, and through holes through which the electron beams do not pass. Further, the lens electrodes 1a and 1b are, in partial regions thereof, fixed to the distance defining member 4.

Next, the structure, action, effect, and the like, of the charged particle beam lens according to this embodiment are described.

In FIGS. 1A and 1B, the charged particle beam lens includes the two electrodes that sandwich the distance defining member 4, but this does not specifically limit the number of the electrodes according to the present invention.

With regard to the thickness of the electrodes, from the viewpoint of maintaining the shape for realizing finer exposure and keeping the lens strength, it is preferred that the thickness be about 10 to 300 µm, but no specific limitation is made.

Multiple first through holes 2 exist in each of the electrodes. It is preferred that the first through holes 2 have an opening diameter of 0.5 to 200 µm and the shape thereof be a perfectly circular cylinder, but insofar as no problem arises in aberration and processing, no specific limitation is made to the opening diameter and the shape of the first through holes 2.

In FIG. 1A, the first through holes 2 are arranged in an array of 4×4 in the shape of a square lattice as an example, but the number, the arrangement, and the forming places of the through holes 2 are not limited thereto, and are determined in accordance with the specifications of the charged particle beam exposure apparatus that uses the charged particle beam lens, and the like.

Further, in FIG. 1A, the contours of the electrodes 1a and 1b are each a rectangle, but both of the dimensions and the shape are not limited thereto, and are determined similarly to the above.

It is preferred that the material used as a substrate of the electrodes 1a and 1b be silicon from the viewpoint of processibility, and the like, but the substance of the material, the structure, and the like, are not specifically limited insofar as a conductive material is included.

Further, it is preferred that the second through holes 3a be provided in an electrode to which the optical aberration characteristics are sensitive.

An electrode to which the optical aberration characteristics are sensitive as used herein means an electrode having an opening with a shape that has a profound effect on the optical aberration. Generally, the optical aberration is sensitive to the shape of an opening in a deceleration electrode. For example, when a negative potential that is larger than that applied to the electrode 1a is applied to the electrode 1b, the optical aberration characteristics are sensitive to change in shape of the first through holes 2 in the electrode 1b.

Further, it is preferred that at least one second through hole 3a be provided in a first region of the electrode 1b and in a second region of the electrode 1b that exists so as to be opposed to the first region of the electrode 1b with respect to the gap 5, but the second through holes 3a may also be provided in the electrode 1a that is located on a side of an object 7 of the application with respect to the electrode 1b.

The shape of the second through holes 3a provided in the electrode 1a, however, is determined such that the total exhaust conductance of all the through holes in the electrode 1a is less than that in the electrode 1b to which the optical aberration characteristics are sensitive.

Specifically, the total exhaust conductance from the gap 5 via the through holes provided in the electrode 1a as the first electrode to the outside of the gap (outside of the lens electrode) is set to be less than the total exhaust conductance from the gap 5 via the through holes provided in the electrode 1b as the second electrode to the outside of the gap (outside of the lens electrode).

In the case of a lens having more than two lens electrodes, at least one of the electrodes to which the optical aberration characteristics are less sensitive among electrodes located on the side of the object of the application with respect to the electrode to which the optical aberration characteristics are most sensitive, is not provided with the second through holes, or the total exhaust conductance of all the through holes in that electrode is caused to be the least.

It is preferred that the second through holes be not formed in the electrode that is the nearest to the object of the application, but, insofar as the above-mentioned conditions are satisfied, no specific limitation is made.

In addition, insofar as the above-mentioned conditions are satisfied, a through hole may be formed in the electrodes 1a and 1b at a position that is not opposed to the gap 5 and through which the charged particle beams pass, and a through hole may also be formed in the distance defining member at a corresponding position.

It is preferred that the cross-sectional area of each of the second through holes 3a be sufficiently greater than the cross-sectional area of each of the first through holes 2, but the present invention is not necessarily limited thereto. In addition, the shape of the second through holes 3a is not specifically limited.

Further, the cross-sectional area and the shape of each of the second through holes 3a in one lens array are not required to be the same, and may vary depending on the location and the electrode. The positions of the second through holes 3a are not specifically limited insofar as the above-mentioned conditions are satisfied.

Further, the positions of the second through holes 3a in one lens array may vary depending on the location and the electrode.

The above-mentioned structure can inhibit as much as possible adhesion of a substance ascribable to the resist from the object 7 of the application to a lens opening in the electrode 1b inside the lens, to which the optical aberration characteristics are particularly sensitive.

This can alleviate the deterioration of the aberration, and thus, not only the operating time until cleaning treatment can be lengthened, but also, the number of times the cleaning treatment is applied can be reduced. Further, by increasing the exhaust conductance, in cleaning, a satisfactory effect of cleaning treatment can be obtained with regard to the electrode 1b inside the lens to which the optical aberration characteristics are sensitive. Therefore, it is expected that the time taken to apply the cleaning treatment may be reduced and damage to the lens array due to the cleaning treatment may be alleviated.

By the way, the exhaust conductance is defined as follows. Resistance caused when a gas flows through an orifice or a tube is referred to as exhaust resistance, and the inverse of the resistance is referred to as (discharge) conductance, which describes ease of gas flow.

When pressures applied to both ends of an orifice or a tube having a conductance $C(m3 \cdot s^{-1})$ are P0 and P1 (Pa), respectively, a flow rate Q of a gas that flows therethrough is given by the following equation:

$$Q=C(P_1-P_0)(Pa \cdot m^3 \cdot s^{-1}).$$

It follows that the conductance C is given by the following equation:

$$C=Q/(P_1-P_0)(Pa^{-1} \cdot m^3 \cdot s^{-1}).$$

The distance defining member 4 itself may have an opening formed therein that communicates between the gap 5 and space outside the lens.

Generally, however, with regard to a distance defining member for a fine objective lens, taking into consideration the structural strength against electrostatic force and the deformation allowance of the electrode, the ratio of the width of an opening in the member to the thickness of the member on the outer periphery of the lens is ten or more, and the ratio of the length of the opening is twenty or more.

Therefore, even when an opening that communicates to the outside exists, the exhaust conductance is extremely small, and a case in which the exhaust conductance of the distance defining member 4 exceeds the exhaust conductance of the electrodes 1a and 1b is rare, and the influence on the effect of the present invention is limited.

Further, when an opening in the outer periphery of the lens has a certain exhaust conductance, radicals are less liable to reach the center of the lens in cleaning, which causes an uneven distribution of the cleaning effect. Therefore, it is preferred not to provide an unnecessary opening or space in the outer periphery of the lens of the distance defining member 4.

In this case, although not illustrated in the figures, other thin films, grooves, through holes, or the like, in necessary patterns, such as an alignment mark between the electrode 1a or 1b and the distance defining member 4 for exposing a pattern or in fabricating the lens, may be appropriately formed on or in the electrodes 1a and 1b and the distance defining member 4.

Further, it is preferred that the thickness of the distance defining member 4 be 50 to 1,000 μm, but the thickness is not limited thereto and is determined in accordance with the specifications of the charged particle beam exposure apparatus that uses the charged particle beam lens, and the like.

It is preferred that the distance defining member 4 is formed of an insulator such as silicon dioxide (SiO2), soda lime glass, borosilicate glass, low alkali glass, non-alkali glass, or a ceramic, such as alumina, or a member containing any of these insulators, but is not limited thereto.

Further, in FIG. 1B, inner walls of the gap 5 are vertical in section.

In order to prevent charge and to improve the withstand voltage, it is preferred that the inner walls be uneven or tapered in section. Insofar as the influence of the charge is weak and the withstand voltage specification is satisfied, however, the shape of the inner walls is not specifically limited.

The member 4 enables maintenance of the strength, the accuracy of the shape, and the withstand voltage structure of the charged particle beam lens array.

Although not illustrated in the figures, other thin films, grooves, through holes, or the like, in necessary patterns, such as a power supplying pad and an alignment mark between the electrodes 1a and 1b and between the electrode 1a or 1b and the distance defining member 4 for exposing a pattern or in fabricating the lens, may be appropriately formed on the electrodes 1a and 1b.

Further, an antistatic film 8 may be formed. In this case, the antistatic film 8 removes charge accumulated on the surface of an insulating material by covering the surface of the insulating material with a conductive film.

Ordinarily, the surface resistivity of the antistatic film 8 is required to be $10^{12}$ Ω or less.

In order to obtain a more satisfactory antistatic effect, if the resistance value is lower, the antistatic effect is improved, but the lowered resistance value causes the amount of generated heat to be larger, and thus, when the device is formed of different kinds of materials, the shape thereof may be deformed.

It is preferred that the surface resistivity be determined in accordance with the specifications such as the deformation allowance, the antistatic effect, and the like, required in the device on which the film is formed.

Further, in this embodiment illustrated in FIGS. 1A and 1B, a plasma resistant film 9 may be formed at least on inner walls of the through holes 2 in the electrodes 1a and 1b, and front and rear surfaces of the electrodes in proximity thereto.

As the material of the plasma resistant film 9, the following materials may be used.

That is, examples thereof may include Au, Ru, Rh, Pd, Os, Ir, Pt, Mo, Cr, conductive metal oxides, such as zinc oxide (ZnO), molybdenum dioxide ($MoO_2$), palladium dioxide ($PdO_2$), and platinum dioxide ($PtO_2$), conductive complex oxides, such as lanthanum nickel complex oxide ($LaNiO_3$), calcium chromate ($CaCrO_3$), and strontium ruthenate ($SrRuO_3$), conductive metal nitrides, such as TiN and TaN, conductive metal carbides, and conductive metal borides.

The material of the plasma resistant film 9 may, however, be other materials that are more resistant to plasma than the above-mentioned materials of the electrodes and that remain conductive even after plasma treatment, and the material is not limited to the above-mentioned materials.

By forming the film, charge due to oxidation of the electrodes can be prevented, and, for example, damage to the electrodes due to cleaning treatment using plasma can be alleviated and charge can be prevented even after multiple times of the treatment.

Next, a method of manufacturing the electrostatic charged particle beam objective lens according to this embodiment is described.

The electrodes 1a and 1b are processed as follows.

The through holes 2 and 3a can be formed using general photolithography technology and general deep dry etching technology, and no specific limitation is made. For example, when a silicon wafer or a silicon on insulator (SOI) wafer is used as the material, the through holes are formed by, after a mask material is formed on the surface of the wafer, carrying out patterning by general photolithography, and then carrying out etching to process a mask. After that, the through holes are formed by deep dry etching using the BOSCH method, and then the mask is removed. In this way, the through holes can be formed. Other necessary patterns for a power supplying pad, an alignment mark, and the like, are appropriately formed on the electrodes. The gap 5 in the distance defining member 4, and the like, can be formed by machining such as drilling or blasting, or, general photolithography technology and general etching technology, and no specific limitation is made.

No specific limitation is made to the method of forming the antistatic film 8 and the plasma resistant film 9.

Taking into consideration the necessity of forming a sufficient film on the inner walls of the through holes, it is preferred that the film forming method be an isotropic film forming method such as CVD, but it is necessary to appropriately select the film forming method in accordance with the shape of the through holes, the film forming materials, and the like.

Further, with regard to the method of fixing members of the lens, it is preferred that the members be bonded together using a general bonding technology after openings in the members are aligned, but the fixing method, and whether or not such fixing is necessary, are not specifically limited, insofar as the members do not go out of alignment while the apparatus is operated.

By adopting the above-mentioned structure, for example, accumulation of an adhering substance ascribable to the resist inside the objective lens, and the like, in particular, on an opening to which the optical aberration characteristics are sensitive, can be reduced.

Further, the effect of the cleaning treatment against the accumulation on an opening in an intermediate electrode to which the optical aberration characteristics of the objective lens are most sensitive can be improved.

Further, the vacuum in the charged particle beam lens can be improved, and accordingly, accumulation of an adhering substance ascribable to the resist on the electrodes can be reduced, and further, a satisfactory state with regard to the withstand voltage and the optical aberration characteristics can be maintained for a long time.

These can reduce the time taken for maintenance, such as the cleaning treatment and replacement, with respect to the process time, which can improve the throughput.

Further, in the case of cleaning treatment using radicals of an active gas, or the like, a lot of radicals can be introduced into the objective lens, and thus, the surfaces of the lens electrodes can be efficiently cleaned. Therefore, more satisfactory lens characteristics can be repeatedly reproduced.

Examples of the present invention are described in the following.

EXAMPLE 1

Figure 2A:
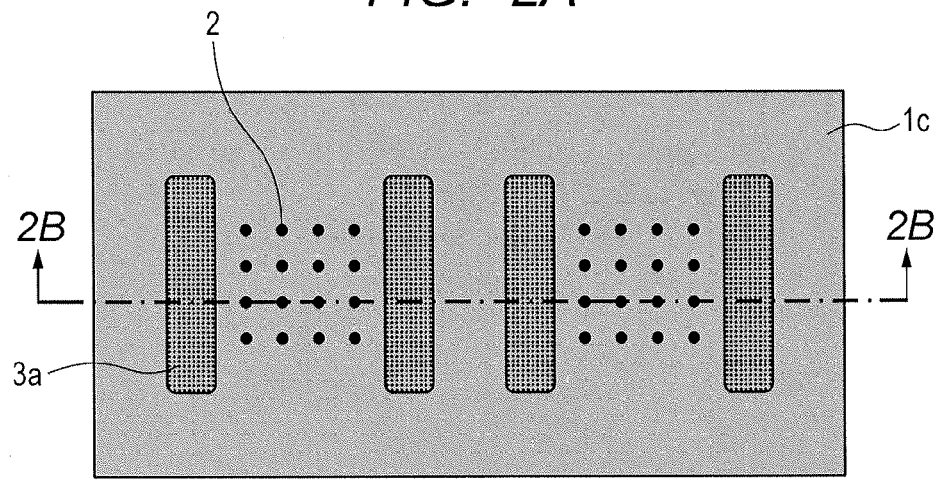
FIG. 2A is a schematic top view illustrating a structure of an electrostatic charged particle beam objective lens according to Example 1 of the present invention.
Figure 2B:
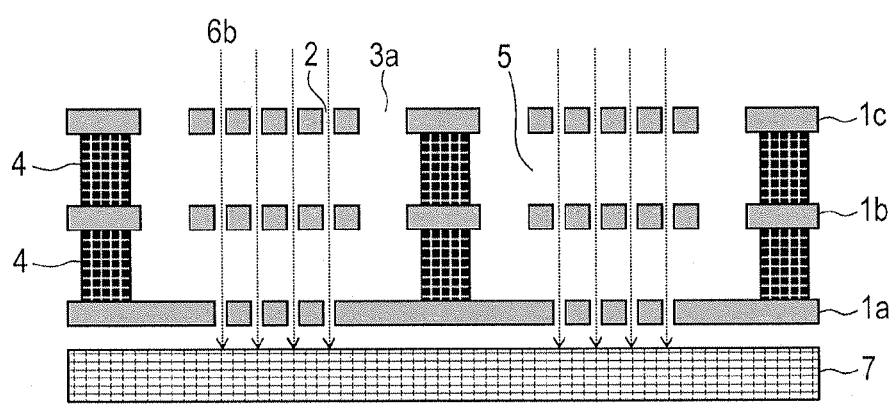
FIG. 2B is a schematic sectional view taken along the line 2B-2B of FIG. 2A.

As Example 1, an exemplary structure of an electrostatic charged particle beam objective lens to which the present invention is applied is described with reference to FIGS. 2A and 2B.

The electron lens according to this example includes three electrodes 1a, 1b, and 1c, which sandwich the distance defining members 4.

The three electrodes are a lower electrode 1a and an upper electrode 1c, which are ground electrodes, and an intermediate electrode 1b, which is a cathode, and which applies a negative high voltage of −4.0 kV.

All three of the electrodes 1a, 1b, and 1c have a thickness of 150 μm and are formed by processing a silicon wafer.

Note that, the upper electrode 1c is on the side of an electron source and the lower electrode 1a is on the side of the object 7 of the application. Thirty-two through holes 2 in total through which electron beams 6b pass are formed in each of the electrodes. The through holes 2 each have a shape of a circular cylinder having a diameter of 100 μm and are arranged in two arrays of 4×4 in the shape of a square lattice with a pitch of 200 μm. Each of the intermediate electrode 1b and the upper electrode 1c has four second through holes 3a in total formed therein, each sized to be 400 μm×1,500 μm for increasing the exhaust conductance in the lens.

The lower electrode 1a does not have the second through holes 3a formed therein. Note that, the first through holes 2 and the second through holes 3a are formed by general photolithography technology, general etching technology, and general deep RIE technology using the BOSCH method.

Further, the gap 5 sized to be 2.0 mm×2.0 mm through which the electron beams 6b pass are formed in the distance defining member 4. The gap 5 is sandwiched between regions including the first through holes 2 and the second through holes 3a of the electrodes 1a, 1b, and 1c, which are opposed to each other.

Note that, the distance defining member 4 is formed of a TEMPAX Float (manufactured by SCHOTT AG) glass, which is an insulator having a thickness of 500 μm. The gap 5 is formed by drilling.

Further, the electrode 1a and the distance defining member 4, the distance defining member 4 and the electrode 1b, and the distance defining member 4 and the electrode 1c are, after being aligned with each other using alignment marks (not shown), bonded together by anodic bonding. After that, regions including the alignment marks are cut away by dicing.

Further, the distance between the lower electrode 1a and the object 7 of the application is 100 μm.

The above-mentioned structure can reduce adhesion of a substance ascribable to the resist from the object 7 of the application to the electrode 1b to which the optical aberration characteristics are sensitive, and electron lens characteristics with a low aberration can be maintained for a long time.

Further, even when plasma cleaning treatment is applied, the treatment can be applied uniformly in a short time. A fine long-life electron lens array can be supplied with stability.

EXAMPLE 2

As Example 2, an exemplary structure of an electrostatic charged particle beam objective lens, which is different from the electrostatic charged particle beam objective lens in Example 1 above, is described with reference to FIGS. 3A and 3B.

Figure 3A:
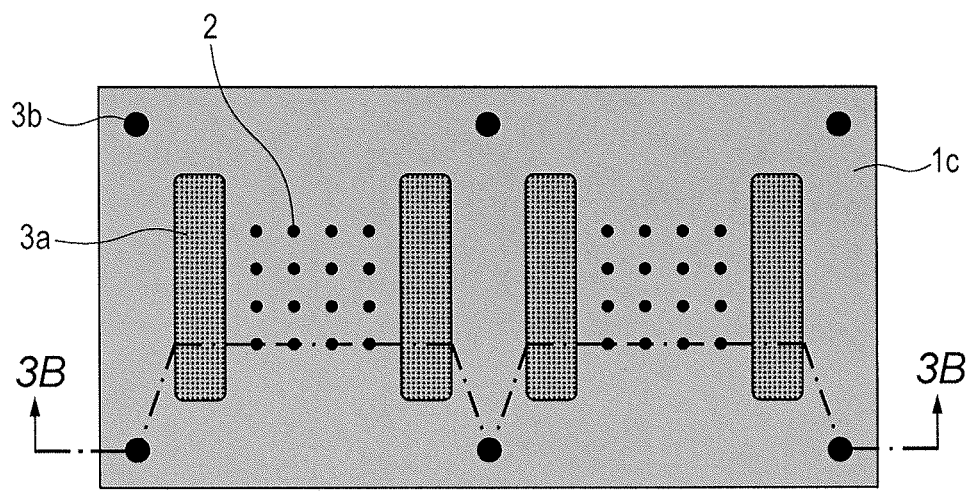
FIG. 3A is a schematic top view illustrating a structure of an electrostatic charged particle beam objective lens according to Example 2 of the present invention.
Figure 3B:
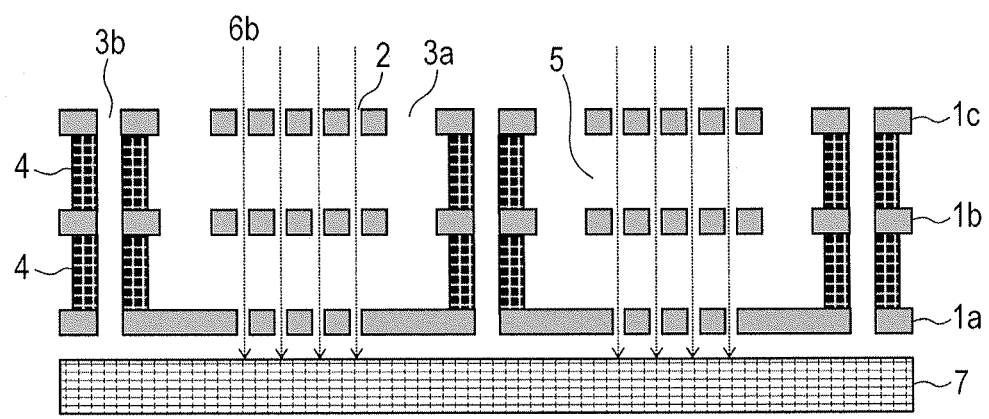
FIG. 3B is a schematic sectional view taken along the line 3B-3B of FIG. 3A.

FIG. 3A is a schematic top view illustrating an electron lens array according to the present invention. FIG. 3B is a schematic sectional view taken along the line 3B-3B of FIG. 3A. The electron lens includes three electrodes 1a, 1b, and 1c, and the distance defining member 4 is sandwiched between the electrode 1a and the electrode 1b, and between the electrode 1b and the electrode 1c.

The three electrodes are an upper electrode 1c and a lower electrode 1a that are ground electrodes, and an intermediate electrode 1b that is a cathode and that applies a negative high voltage of −3.7 kV. All the three electrodes 1a, 1b, and 1c have a thickness of 100 μm and are formed by processing a silicon wafer. Note that, the upper electrode 1c is on the side of an electron source and the lower electrode 1a is on the side of the object 7 of the application.

Thirty-two first through holes 2 in total are formed in each of the electrodes. The through holes 2 each have a shape of a circular cylinder having a diameter of 100 μm and are arranged in two arrays of 4×4 in the shape of a square lattice with a pitch of 300 μm.

Each of the upper electrode 1c and the intermediate electrode 1b has four second through holes 3a in total formed therein, each sized to be 500 μm×1,500 μm.

Further, third through holes that pass between the lower electrode 1a and the upper electrode 1c in the direction of an optical axis are formed outside the gap 5 so as not to communicate to the gap 5.

Specifically, in order to increase the exhaust conductance between the lower electrode 1a and the object 7 of the application, six third through holes 3b in total, which have a diameter of 300 μm and which pass through the electrodes in the direction of the optical axis of the electron beams, are provided near corners and edges of the electrodes 1a, 1b, and 1c outside the gap 5.

Note that, those through holes are formed by general photolithography technology, general etching technology, and general deep RIE technology using the BOSCH method.

Further, the gap 5 sized to be 2.6 mm×2.6 mm, through which the electron beams 6b pass, is formed in the distance defining member 4. The gap 5 is sandwiched between regions including the first through holes 2 and the second through holes 3a of the electrodes 1a, 1b, and 1c, which are opposed to each other.

Further, through holes corresponding to the third through holes 3b are formed in the distance defining member 4 so as to have the same diameter and so as to be located at the same positions as those in the electrodes. Note that, the distance defining member 4 is formed of an EAGLE XG (manufactured by Corning Incorporated) glass, which is an insulator having a thickness of 400 μm.

The gap 5 and the through holes in the distance defining member 4 corresponding to the third through holes 3b are formed by drilling.

Further, the electrode 1a and the distance defining member 4, and the distance defining member 4 and the electrode 1b are, after the through holes 2 therein are aligned with each other, bonded together by fusion bonding. Further, the distance between the lower electrode 1a and the object 7 of the application is 100 μm.

The above-mentioned structure can more reduce adhesion of a substance ascribable to the resist from the object 7 of the application to the inner walls of the first through holes 2 in the electrodes and to the proximity to the through holes, in particular, to the electrode 1b to which the optical aberration characteristics are sensitive, as compared with the structure of Example 1, and electron lens characteristics with a low aberration can be maintained for a long time.

Further, even when plasma cleaning treatment is applied, the treatment can be applied uniformly in a short time. A fine long-life electron lens array can be supplied with stability.

EXAMPLE 3

As Example 3, an exemplary structure of an electrostatic charged particle beam objective lens that is different from the above-mentioned examples is described with reference to FIG. 4.

Figure 4:
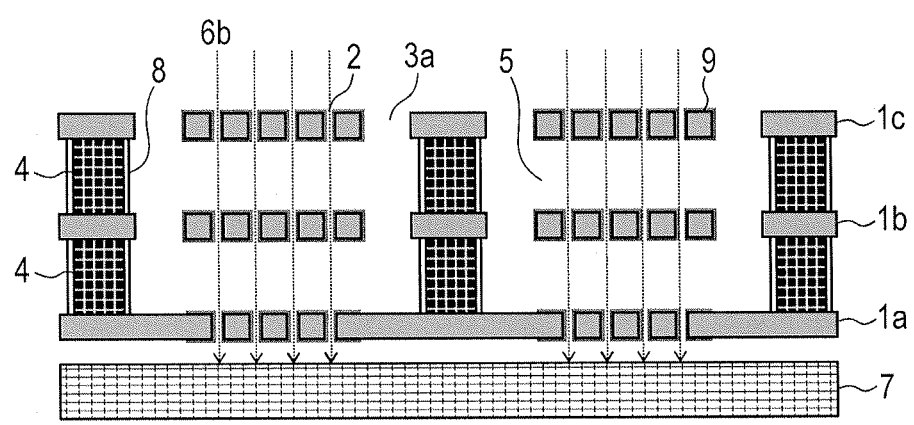
FIG. 4 is a schematic sectional view of an electrostatic charged particle beam objective lens according to Example 3 of the present invention.

FIG. 4 is a schematic sectional view of an electron lens array according to this example.

The electron lens includes three electrodes 1a, 1b, and 1c, and the distance defining member 4 is sandwiched between the electrode 1a and the electrode 1b, and between the electrode 1b and the electrode 1c.

The three electrodes are an upper electrode 1c and a lower electrode 1a, which are ground electrodes, and an intermediate electrode 1b, which is a cathode, and which applies a negative high voltage of −3.7 kV.

All three of the electrodes 1a, 1b, and 1c have a thickness of 100 µm and are formed by processing a silicon wafer.

Note that, the upper electrode 1c is on the side of an electron source and the lower electrode 1a is on the side of the object 7 of the application. Thirty-two first through holes 2 in total are formed in each of the electrodes. The first through holes 2 each have a shape of a circular cylinder having a diameter of 100 µm and are arranged in two arrays of 4×4 in the shape of a square lattice with a pitch of 200 µm.

Each of the upper electrode 1c and the intermediate electrode 1b has four second through holes 3a in total formed therein, each sized to be 400 µm×1,200 µm.

Note that, the through holes are formed by general photolithography technology, general etching technology, and general deep RIE technology using the BOSCH method.

Further, the gap 5 sized to be 2.0 mm×2.0 mm, through which the electron beams 6b pass, is formed in the distance defining member 4. The gap 5 is sandwiched between regions including the first through holes 2 and the second through holes 3a of the electrodes 1a, 1b, and 1c, which are opposed to each other.

Note that, the distance defining member 4 is formed of OA-21 (manufactured by NIPPON ELECTRIC GLASS CO., LTD.) glass, which is an insulator having a thickness of 400 µm.

The gap 5 is formed by sandblasting. The antistatic film 8 for preventing charge of the electrodes is formed at a thickness of 0.5 µm on the inner walls of the gap 5 and on part of the electrodes 1a, 1b, and 1c to be continued from the film 8 on the inner walls. The material is AlN, and the film 8 is formed by sputtering.

The plasma resistant film 9 is formed on the inner walls of the first through holes 2 and the front and rear surfaces of the electrodes 1a, 1b, and 1c in proximity to the first through holes 2 in regions of 1.1 mm×1.1 mm at a thickness of 200 nm. The material is Mo, and the film is formed by CVD.

Further, the electrode 1a and the distance defining member 4, and the distance defining member 4 and the electrode 1b are, after the through holes 2 therein are aligned with each other, bonded together by fusion bonding. Further, the distance between the lower electrode 1a and the object 7 of the application is 100 µm.

The above-mentioned structure can reduce adhesion of a substance ascribable to the resist from the object 7 of the application to the inner walls of the first through holes 2 in the electrodes and to the proximity to the through holes, in particular, to the electrode 1b to which the optical aberration characteristics are sensitive, and electron lens characteristics with a low aberration can be maintained for a long time.

Further, even when plasma cleaning treatment is applied, the treatment can be applied uniformly in a short time. In addition, by forming the plasma resistant film 9, the electron lens characteristics can be maintained even after plasma cleaning treatment is applied repeatedly, and the life of the electron lens array becomes longer.

In this manner, the number of times of maintenance can be reduced, and thus, the stoppage time of the apparatus can be shortened. Therefore, the throughput becomes higher. And a fine long-life electron lens array can be supplied with stability.

EXAMPLE 4

Figure 5:
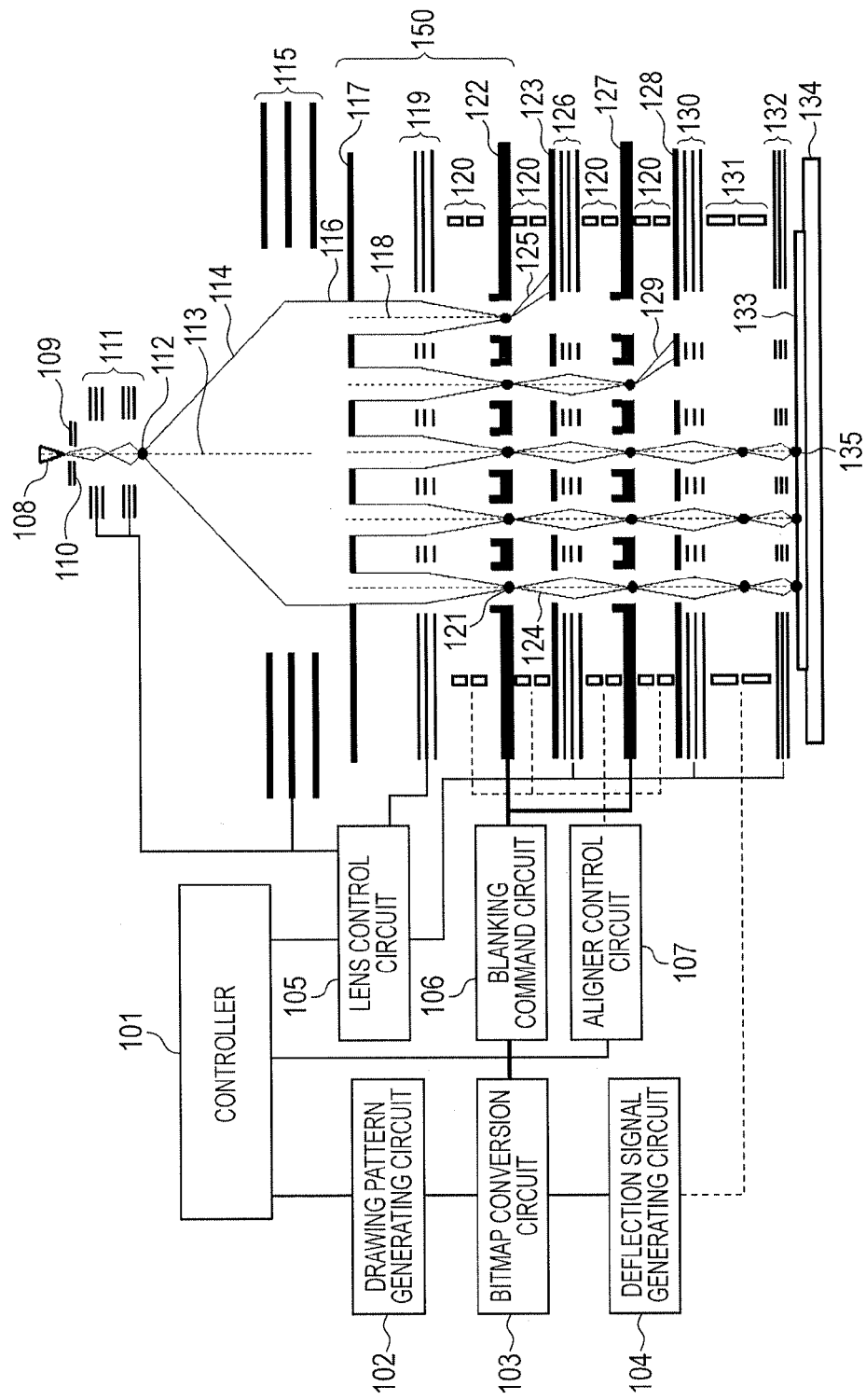
FIG. 5 illustrates a structure of a charged particle multi-beam exposure apparatus according to Example 4 of the present invention.

As Example 4, an exemplary structure of a charged particle beam exposure apparatus (charged particle multi-beam exposure apparatus) is described with reference to FIG. 5.

In this example, an exemplary structure of a charged particle beam exposure apparatus, in which the electrostatic charged particle beam lens according to the present invention forms an electrostatic objective lens, is described.

This example does not, however, mean to limit the application of the electrostatic charged particle beam lens according to the present invention to a charged particle beam exposure apparatus. The present invention can be applied to any charged particle beam apparatus. Further, this example is a so-called multi-column exposure apparatus having individual projection systems.

Radiated electron beams that are drawn from an electron source 108 by an anode electrode 110 form a radiation optical system crossover 112 by a crossover adjustment optical system 111. The electron source 108, the anode electrode 110, and the crossover adjustment optical system 111 form a beam generating unit.

Here, as the electron source 108, a so-called thermionic electron source, such as $LaB_6$ or BaO/W (dispenser cathode) is used.

The crossover adjustment optical system 111 includes two-stage electrostatic lenses. Each of the first stage electrostatic lens and the second stage electrostatic lens includes three electrodes, and is a so-called Einzel electrostatic lens, in which a negative voltage is applied to an intermediate electrode, and an upper electrode and a lower electrode are grounded.

Electron beams that are radiated to a wide area from the radiation optical system crossover 112 become collimated beams by a collimator lens 115, and are applied to an aperture array 117. Multi-electron beams 118 divided by the aperture array 117 are individually condensed by a converging lens array 119, and images are formed on a blanker array 122.

In this case, the converging lens array 119 is an electrostatic lens including three porous electrodes, and is an Einzel electrostatic lens array, in which a negative voltage is applied only to an intermediate electrode among the three electrodes and an upper electrode and a lower electrode are grounded.

The aperture array 117 also has the function of defining the numerical aperture NA (convergence half angle), and thus, is placed on the pupil plane of the converging lens array 119 (front focal plane of the converging lens array). The blanker array 122 is a device having individual deflection electrodes, and turns on/off the beams individually based on a blanking signal generated by a drawing pattern generating circuit 102, a bitmap conversion circuit 103, and a blanking command circuit 106 in accordance with a drawing pattern.

When a beam is in an ON state, no voltage is applied to the corresponding deflection electrode of the blanker array 122, and, when a beam is in an OFF state, a voltage is applied to the corresponding deflection electrode of the blanker array 122 to deflect the beam in the multi-electron beams. A beam 125 in the multi-electron beams deflected by the blanker array 122 is blocked by a stop aperture array 123 in the subsequent stage, and the beam is turned off.

In this example, the blanker array is formed in two stages, and a second blanker array 127 and a second stop aperture array 128, which have the same structures as those of the blanker array 122 and the stop aperture array 123, respectively, are provided in the subsequent stage.

The multi-electron beams that have passed through the blanker array 122 form images on the second blanker array 127 by a second converging lens array 126.

Further, the multi-electron beams are condensed by third and fourth converging lenses to form images on a wafer 133. In this case, the second converging lens array 126, a third converging lens array 130, and a fourth converging lens array 132 are, similarly to the converging lens array 119, Einzel electrostatic lens arrays.

In particular, the fourth converging lens array 132 is an objective lens, and the reduction ratio is set to be about 1/100. This causes an electron beam 121 on an intermediate image forming plane of the blanker array 122 (spot diameter (FWHM) of 2 μm) to be reduced to 1/100 on the surface of the wafer 133, and the beam in the multi-electron beams forms an image of about 20 nm (FWHM) on the wafer. The fourth converging lens array 132 uses the electrostatic charged particle beam lens array according to the present invention, and a fine long-life electron lens array can be supplied with stability.

The multi-electron beams on the wafer can be scanned by a deflector 131. The deflector 131 is formed of opposed electrodes. In order to perform two-stage deflections in x and y directions, the deflector 131 includes four-stage opposed electrodes (in FIG. 5, for the sake of simplicity, a two-stage deflector is illustrated as one unit). The deflector 131 is driven in response to a signal from a deflection signal generating circuit 104.

While a pattern is drawn, the wafer 133 is moved by a stage 134 in the x direction in a continuous manner. Based on the result of length measurement in real time by a laser measuring machine, an electron beam 135 on the surface of the wafer is deflected in the y direction by the deflector 131, and the beam is individually turned on/off in accordance with the drawing pattern by the blanker array 122 and the second blanker array 127.

A controller 101, the drawing pattern generating circuit 102, a bitmap conversion circuit 103, the deflection signal generating circuit 104, a lens electrode control circuit 105, the blanking command circuit 106, and an aligner control circuit 107 form a control unit.

According to the operation described above, a desired pattern is drawn on the surface of the wafer 133 at high speed.

As described above, according to the charged particle multi-beam exposure apparatus using the charged particle beam lens of this example, a fine long-life charged particle beam exposure apparatus can be provided with stability. Further, in addition to drawing using multiple charged particle beams, the stop time of the apparatus due to maintenance can be shortened, and thus, a charged particle beam exposure apparatus with high resolution and high throughput can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A charged particle beam lens comprising:
  a first electrode on a downstream side and a second electrode on an upstream side in a travelling direction of a charged particle beam, wherein each of the first electrode and the second electrode has a first through hole formed therein, through which the charged particle beam passes, the second electrode has a second through hole formed therein, through which the charged particle beam does not pass;
  a distance defining member provided between the first electrode and the second electrode, such that the first electrode and the second electrode are spaced away from each other; and
  a gap surrounded by the first electrode, the second electrode, and the distance defining member, wherein both the first through hole and the second through hole communicate to the gap,
  wherein a third through hole passes through the first electrode and the second electrode in the travelling direction of the charged particle beam, the third through hole being provided outside of the gap and not communicating to the gap.

2. The charged particle beam lens according to claim 1, wherein total exhaust conductance from the gap via the through holes in the first electrode to outside of the gap is less that total exhaust conductance from the gap via the through holes in the second electrode to outside of the gap.

3. The charged particle beam lens according to claim 1, wherein the first electrode comprises an electrode that is nearest to an object of application of the charged particle beam.

4. The charged particle beam lens according to claim 1, further comprising a conductive film that is resistant to plasma, and is formed in regions of the first electrode and the second electrode in which the first through hole is formed.

5. The charged particle beam lens according to claim 1, further comprising an antistatic film for preventing charge of the first electrode and the second electrode, the antistatic film being formed on an inner wall of the gap.

6. A charged particle beam exposure apparatus comprising:
  a beam generating unit for generating a charged particle beam;
  a blanker array for controlling at least one of one and off of the charged particle beam in accordance with a drawing pattern;
  an objective lens for causing the charged particle beam that has passed through the blanker array to form an image on a wafer; and
  a control unit for controlling the beam generating unit, the blanker array, and the objective lens,
  wherein:
    (i) the objective lens comprises a first electrode on a downstream side and a second electrode on an upstream side in a travelling direction of the charged particle beam,
    (ii) the first electrode and the second electrode are spaced away from each other by a distance defining member provided therebetween,
    (iii) the objective lens has a gap formed therein surrounded by the first electrode, the second electrode, and the distance defining member,
    (iv) each of the first electrode and the second electrode has a first through hole formed therein, through which the charged particle beam passes,
    (v) the second electrode has a second through hole formed therein, through which the charged particle beam does not pass,
    (vi) both the first through holes and the second through holes communicate to the gap, and
    (vii) a third through hole passes through the first electrode and the second electrode in the travelling direction of the charged particle beam, the third through hole being provided outside of the gap and not communicating to the gap.

* * * * *